(12) United States Patent
Lin et al.

(10) Patent No.: US 10,514,510 B2
(45) Date of Patent: Dec. 24, 2019

(54) OPTICAL COMPONENT ASSEMBLY HAVING A KEYED STRUCTURE FOR ENSURING PROPER INSERTION ORIENTATION WITHIN AN OPTICAL SUBASSEMBLY

(71) Applicant: Applied Optoelectronics, Inc., Sugar Land, TX (US)

(72) Inventors: Kai-Sheng Lin, Sugar Land, TX (US);
Justin Lii, Houston, TX (US);
Hao-Hsiang Liao, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 131 days.

(21) Appl. No.: 15/241,979

(22) Filed: Aug. 19, 2016

(65) Prior Publication Data

US 2017/0059786 A1   Mar. 2, 2017

Related U.S. Application Data

(63) Continuation-in-part of application No. 14/837,993, filed on Aug. 27, 2015, now abandoned.

(51) Int. Cl.
*G02B 6/32* (2006.01)
*G02B 6/42* (2006.01)
(Continued)

(52) U.S. Cl.
CPC ............. *G02B 6/3831* (2013.01); *G02B 5/26* (2013.01); *G02B 6/423* (2013.01); *G02B 6/4246* (2013.01);
(Continued)

(58) Field of Classification Search
CPC .......... G02B 6/32; G02B 6/34; G02B 6/4249; G02B 6/423; G02B 6/4292; G02B 6/4246; G02B 6/4261
(Continued)

(56) References Cited

U.S. PATENT DOCUMENTS 5,405,201 A   4/1995 Senger
6,302,596 B1  10/2001 Cohen et al.
(Continued)

OTHER PUBLICATIONS

PCT Search Report and Written Opinion dated Sep. 22, 2016, received in related PCT Application No. PCT/US16/48943, 15 pgs.
(Continued)

*Primary Examiner* — Thomas A Hollweg
*Assistant Examiner* — Hung Q Lam
(74) *Attorney, Agent, or Firm* — Grossman Tucker Perreault & Pfleger, PLLC; Norman S. Kinsella

(57) ABSTRACT

The present disclosure is directed to a keyed optical component assembly that ensures that the same has a proper orientation when press-fit into or otherwise coupled to a complimentary opening of an optical subassembly housing. In an embodiment, the keyed optical component assembly includes a base portion defined by a first end and a second end disposed opposite the first end along a longitudinal axis. A first arcuate region extends from the first end towards the second end and transitions into a tapered region. A second arcuate region extends from the second end towards the first end and also transitions into the tapered region. Therefore, the tapered region extends between the first arcuate region and the second arcuate region, and generally tapers/narrows from the second arcuate region to the first arcuate region. The resulting shape of the base portion may generally be described as an asymmetric tear-drop shape.

3 Claims, 6 Drawing Sheets

(51) Int. Cl.
*G02B 6/38* (2006.01)
*H04B 10/40* (2013.01)
*G02B 5/26* (2006.01)
*G02B 7/00* (2006.01)
*H01S 5/022* (2006.01)
*G02B 6/26* (2006.01)
*G02B 6/34* (2006.01)
*H01S 5/00* (2006.01)
*H01S 5/40* (2006.01)

(52) U.S. Cl.
CPC ......... *G02B 6/4263* (2013.01); *G02B 6/4292* (2013.01); *G02B 7/006* (2013.01); *H01S 5/02288* (2013.01); *H04B 10/40* (2013.01); *H01S 5/0078* (2013.01); *H01S 5/02212* (2013.01); *H01S 5/02284* (2013.01); *H01S 5/4087* (2013.01)

(58) Field of Classification Search
USPC ................. 385/18, 31, 33, 36, 37, 44, 49, 52
See application file for complete search history.

(56) References Cited

U.S. PATENT DOCUMENTS

| | | | |
|---|---|---|---|
| 6,493,121 B1 | 12/2002 | Althaus | |
| 6,571,033 B2 | 5/2003 | Caracci et al. | |
| 6,854,897 B2 | 2/2005 | Furumai et al. | |
| 7,218,451 B2 | 5/2007 | Lee et al. | |
| 7,296,938 B1* | 11/2007 | Shapson | G02B 6/3891 385/76 |
| 8,160,451 B2 | 4/2012 | Liu et al. | |
| 8,622,632 B2 | 1/2014 | Isenhour et al. | |
| 8,915,602 B2 | 12/2014 | Sugitatsu | |
| 8,979,393 B2 | 3/2015 | Kihara | |
| 9,008,474 B2 | 4/2015 | Nakanishi | |
| 9,143,261 B2 | 9/2015 | Takahashi et al. | |
| 9,191,118 B2 | 11/2015 | Hui et al. | |
| 2005/0147419 A1 | 7/2005 | Verdiell | |
| 2006/0002660 A1 | 1/2006 | Wisecarver et al. | |
| 2006/0088255 A1 | 4/2006 | Wu et al. | |
| 2006/0188211 A1 | 8/2006 | Iwase et al. | |
| 2006/0274999 A1 | 12/2006 | Wu et al. | |
| 2007/0104426 A1 | 5/2007 | Yun et al. | |
| 2007/0122154 A1 | 5/2007 | Nakanishi et al. | |
| 2007/0242957 A1 | 10/2007 | Zhu et al. | |
| 2008/0031574 A1 | 2/2008 | Tanaka | |
| 2009/0034915 A1 | 2/2009 | Oki et al. | |
| 2009/0052898 A1* | 2/2009 | Oki | G02B 6/4246 398/79 |
| 2010/0008093 A1* | 1/2010 | Lin | H01L 31/0203 362/365 |
| 2011/0044696 A1 | 2/2011 | Lim et al. | |
| 2012/0288242 A1 | 11/2012 | Nishizawa et al. | |
| 2012/0308180 A1 | 12/2012 | Tosetti et al. | |
| 2013/0108262 A1* | 5/2013 | Lim | G02B 6/4215 398/43 |
| 2014/0369644 A1 | 12/2014 | Mitsuhashi et al. | |
| 2015/0256261 A1 | 9/2015 | Ho et al. | |
| 2015/0280395 A1 | 10/2015 | Nakazawa | |
| 2015/0334838 A1 | 11/2015 | Ogawa et al. | |
| 2017/0059786 A1 | 3/2017 | Lin et al. | |

OTHER PUBLICATIONS

US Office Action dated Jul. 11, 2016, received in related U.S. Appl. No. 14/837,993, 20 pgs.
US Office Action dated Apr. 2, 2018, received in related U.S. Appl. No. 15/204,174, 28 pgs.
US Office Action dated Feb. 28, 2017, received in related U.S Appl. No. 14/837,993, 33 pgs.
PCT Search Report and Written Opinion dated Sep. 27, 2017, received in PCT Application No. PCT/US17/41178, 8 pgs.
PCT Search Report and Written Opinion dated Oct. 31, 2017, received in PCT Application No. PCT/US17/47567, 8 pgs.
US Office Action dated Sep. 22, 2017, received in related U.S. Appl. No. 15/204,174, 42 pgs.
US Office Action dated Nov. 2, 2018, received in related U.S. Appl. No. 15/204,174, 32 pgs.

* cited by examiner

US 10,514,510 B2

OPTICAL COMPONENT ASSEMBLY HAVING A KEYED STRUCTURE FOR ENSURING PROPER INSERTION ORIENTATION WITHIN AN OPTICAL SUBASSEMBLY

CROSS-REFERENCE TO RELATED APPLICATIONS

This Application is a continuation in part of co-pending U.S. application Ser. No. 14/837,993 filed on Aug. 27, 2015, titled "Multi-Channel Transmitter Optical Subassembly (TOSA) With Opposing Placement of Transistor Outline (TO) Can Laser Packages," which is herein incorporated by reference in its entirety.

TECHNICAL FIELD

The present disclosure relates to optical transceiver modules, and more particularly, to an optical component having a keyed base portion that assists in ensuring correct alignment when coupling the same to an optical subassembly housing.

BACKGROUND INFORMATION

Optical transceivers are used to transmit and receive optical signals for various applications including, without limitation, internet data centers, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to maintaining optical efficiency (power), thermal management, insertion loss, and manufacturing yield.

Optical transceivers can include one or more transmitter optical subassemblies (TOSAs) and receiver optical subassemblies (ROSAs) for the purpose of transmitting and receiving optical signals. As optical transceiver housings scale down in size, the complexity of designing and manufacturing TOSAs and ROSAs to fit within the constrained housings, without sacrificing channel allocation and transceiver performance, continues to increase and raises numerous non-trivial issues.

BRIEF DESCRIPTION OF THE DRAWINGS

These and other features and advantages will be better understood by reading the following detailed description, taken together with the drawings wherein.

Figure 1:
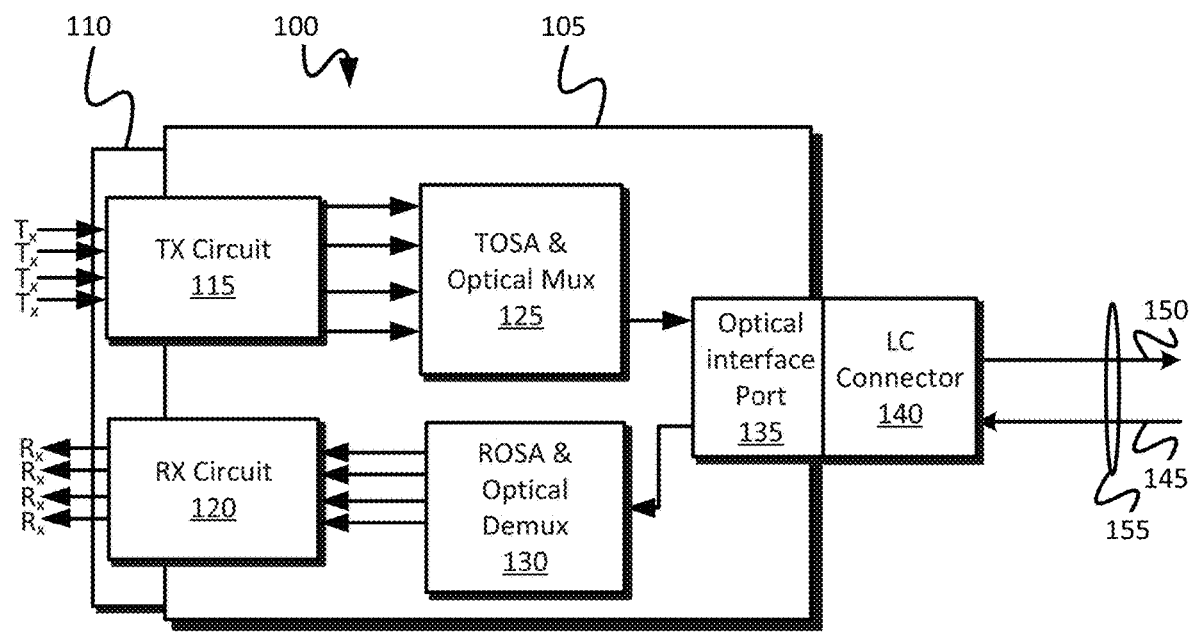
FIG. 1 schematically illustrates an example optical transceiver including a transmitter optical subassembly (TOSA) and a receiver optical subassembly (ROSA).

These and other features of the present embodiments will be understood better by reading the following detailed description, taken together with the figures herein described. The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

As discussed above, continued scaling or shrinking, of optical transceivers and associated components present numerous non-trivial challenges. For example, in optical subassemblies, such as transmitter optical subassemblies (TOSAs) and receiver optical subassemblies (ROSAs), optical component assemblies may be press-fit into position during manufacturing. Such optical component assemblies may include a base portion designed to be coupled with the optical subassembly housing via a press-fit, which is also referred to as a friction-fit or interference-fit, and may further provide a mounting surface for coupling to an optical component such as, for example, a filter, mirror, or photodiode. The optical component may be mounted directly to the surface, or indirectly by way of a mount designed to hold the optical component in a particular orientation. In any event, the optical component assemblies must be oriented in a correct fashion when press-fit into a subassembly housing in order for their associated optical components to ensure nominal performance. Even a relatively small misalignment, for example, a few microns, of the optical components can significantly reduce optical power.

Figure 4:
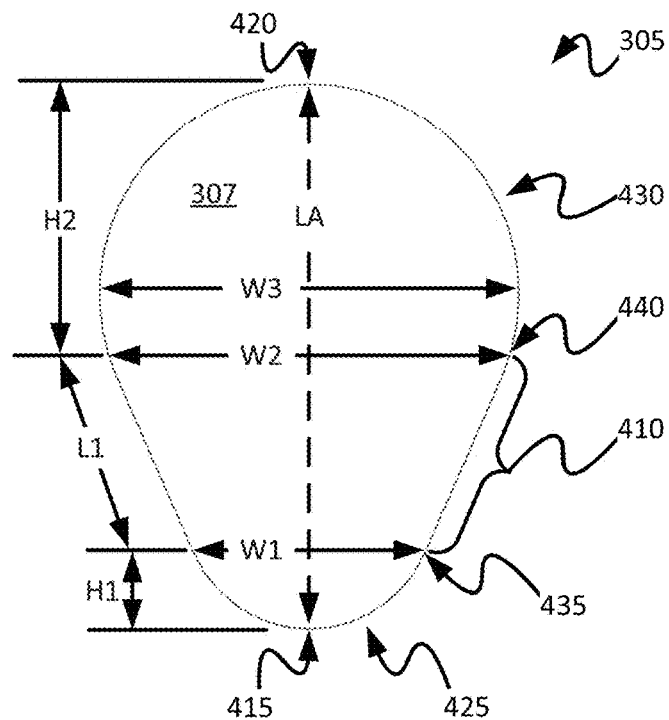
FIG. 4 is a plan view of an example base portion of a keyed optical component assembly consistent with the present disclosure and shows the keyed optical component assembly without an optical component coupled to a mounting surface of the same.

Thus, the present disclosure is directed to a keyed optical component assembly that provides a base portion having a keyed or asymmetric shape. The keyed shape ensures that the keyed optical component assembly has a desired/proper orientation when press-fit into or otherwise coupled to a complimentary (or corresponding) opening of an optical subassembly housing. In an embodiment, the keyed shape of the base portion is defined by a first end and a second end disposed opposite each other along a longitudinal axis. A first arcuate region extends from the first end towards the second end and transitions into a tapered region. A second arcuate region extends from the second end towards the first end and also transitions into the tapered region. Therefore, the tapered region extends between the first arcuate region, and the second arcuate region and generally tapers/narrows from the second arcuate region to the first arcuate region. The resulting shape of the base may generally be described as tear-drop shaped, pear shaped, piriform curve shaped, for example. FIG. 4 shows one example of a base portion with a keyed shape, and will be discussed in greater detail below.

In an embodiment, the base portion of the keyed optical component assembly also defines at least one mounting surface. The mounting surface is configured to be coupled to an optical component (or optical element) such as a filter, mirror, laser diode, lens, diffuser, polarizer, prism, beam splitter, diffraction grating, and any other suitable active or passive optical component. In some embodiments, each optical component is coupled to the mounting surface indirectly using a mount extending outwardly from the mounting surface of the base. Thus, as generally referred to herein, an optical component refers to either a component directly mounted to the mounting surface or a component mounted by way of an intermediate assembly such as a filter mount or mirror holder, for example. Once coupled to the mounting surface, the optical component has an orientation relative to the base. In other words, once coupled to the base, the orientation of the optical component may be described as being fixed relative to the base. Therefore, the orientation of the base within an opening of a subassembly housing also determines the orientation of the optical component. As such, the keyed shape of the base and the corresponding keyed shape of the opening determines the orientation of both the base and the optical component when the base is press-fit into the opening.

While examples and scenarios disclosed herein specifically reference a TOSA, the techniques are equally applicable to other subassemblies such as receiver optical subassemblies (ROSAs). Moreover, the techniques disclosed are also applicable to small form-factor optical subassemblies that include one or more optical components coupled into openings of a subassembly housing during manufacturing.

The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. Likewise, the term "directly coupled" or "directly optically coupled" as used herein refers to any optical connection that allows light to be imparted from one element to another without the use of an intermediate device such as a fiber.

As used herein singular expressions such as "a," "an," and "the" are not limited to their singular form, and are intended to cover the plural forms as well unless the context clearly indicates otherwise.

From time to time one or more aspects of the present disclosure may be described using ranges. In such instances it should be understood that the indicated ranges are exemplary only unless expressly indicated otherwise. Moreover, the indicated ranges should be understood to include all of the individual values of falling within the indicated range, as though such values were expressly recited. Moreover, the ranges should be understood to encompass sub ranges within the indicated range, as though such sub ranges were expressly recited. By way of example, a range of 1 to 10 should be understood to include 2, 3, 4 . . . etc., as well as the range of 2 to 10, 3 to 10, 2 to 8, etc., as though such values and ranges were expressly recited.

Example Optical Transceiver System and Operation

Turning now to FIG. 1, an embodiment of an optical transceiver 100 includes a TOSA 125 for transmitting an optical signal and a ROSA 130 for receiving an optical signal. In some embodiments, the TOSA 125 is a multi-channel TOSA and the ROSA 130 is a multi-channel ROSA. As shown, a transceiver housing 105 includes the TOSA 125 and the ROSA 130. A transmit connecting circuit 115 and a receive connecting circuit 120 provide electrical connections to the TOSA 125 and the ROSA 130, respectively, within the transceiver housing 105. The transmit connecting circuit 115 and the receive connecting circuit 120 may communicate with external systems via data bus 110. In some cases, data bus 110 is a 38-pin connector that comports with, for example, specification SFF-8436 titled "QSFP+ 10 Gbs 4× PLUGGABLE TRANSCEIVER Rev. 4.8" (hereinafter "QSFP+").

In any event, the transmit connecting circuit 115 electrically couples to an electronic component in the TOSA 125 (e.g., a TO can laser package), and the receive connecting circuit 120 electrically couples to an electronic component (e.g., a photodiode package) in the ROSA 130. The transmit connecting circuit 115 and the receive connecting circuit 120 include at least conductive paths to provide electrical connections, and may also include additional circuitry. The TOSA 125 is coupled to an optical interface port 135. The optical interface port 135 may include an LC connector port, although other connector types are also within the scope of this disclosure.

In cases where the optical interface port 135 comprises a duplex, or bi-directional, LC receptacle, the LC connector port provides optical connections to the TOSA 125, and provides optical connections to the ROSA 130. The LC connector port may be configured to receive and be coupled to a mating LC connector 140 such that a transmitter optical fiber 150 of the external fibers 155 optically couples to the TOSA 125, and the receiver optical fiber 145 of the external fibers 155 optically couples to the ROSA 130.

The TOSA 125 includes at least one TO can laser package and at least one optic for producing at least one associated channel wavelength, and couples the same into the transmitter optical fiber 150. In particular, the TOSA 125 converts electrical data signals received via the transmit connecting circuit 115 into modulated optical signals transmitted over the transmitter optical fiber 150 using at least one laser. The laser may be, for example, a distributed feedback (DFB) laser. The TOSA 125 may also include a monitor photodiode for monitoring the light emitted by the laser. The TOSA 125 may further include one or more temperature control devices, such as a resistive heater and/or a thermoelectric cooler (TEC), for controlling a temperature of the lasers, for example, to control or stabilize the laser wavelengths.

The ROSA 130 includes at least one photodiode package and an optical component such as a mirror or a filter for receiving an optical signal. The ROSA 130 can detect, amplify, and convert optical signals received via receiver optical fiber 145, and can provide the converted optical signals as electrical data signals that are output via the receive connecting circuit 120. In some cases, the photodiode package includes an integrated transimpedance amplifier (TIA).

Figure 2:
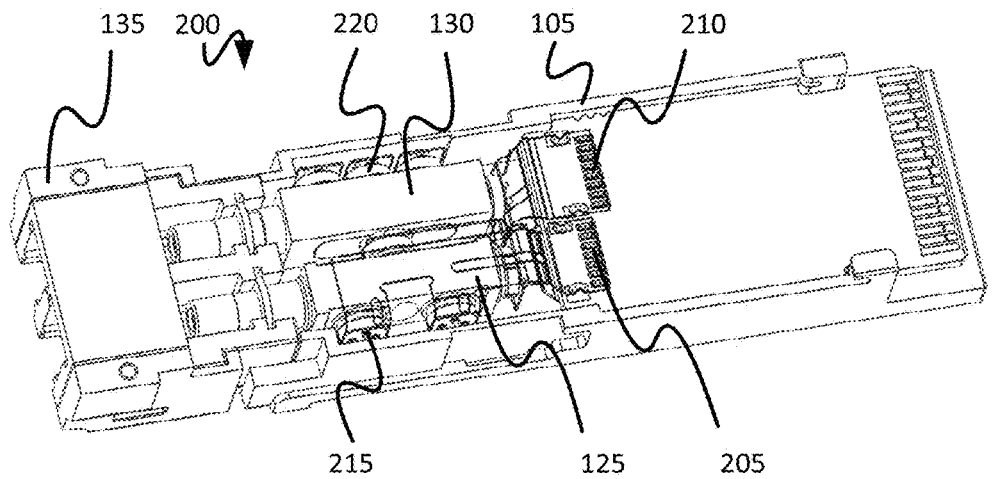
FIG. 2 is a perspective view of an example small form-factor (SFF) pluggable transceiver with a TOSA and a ROSA.

Referring also to FIG. 2, an example small form-factor (SFF) pluggable optical transceiver 200 with a TOSA and a ROSA is described and shown in greater detail. In an embodiment, the optical transceiver 200 may implement, the QSFP+ specification, although other embodiments are within the scope of this disclosure. As shown, the optical transceiver 200 includes a transceiver housing 105, a TOSA 125 in one region of the housing 105, and a ROSA 130 located in another region of the housing 105. The TOSA 125 electrically couples to transmit flexible printed circuits (FPCs) 205 and couples to the optical interface port 135 at an end of the housing 105. The ROSA 130 electrically couples to a receive FPC 210 and couples to the optical interface port 135 at the end of the housing 105.

In some embodiments, the TOSA 125 includes at least one TO can laser package 215. Each TO can laser package 215 may include a laser diode. The output of the TO can laser package 215 may, for example, be in the range of 1.85 mW to 2 W; however, other output powers are within the scope of the current disclosure. The ROSA 130 includes at least one photodiode package 220. Each of the photodiode packages can include, for example, a photodiode and a TIA. In some embodiments, each of the photodiodes provides a sensitivity of approximately −13 dBm or less. Each TO can laser package 215 is optically coupled to a first optical fiber and each photodiode package 220 is optically coupled to a second optical fiber. The TOSA 125 may include one or more press-fit optical component assemblies, such as mirrors, filters, and so on. As discussed further below, the TOSA 125 may be configured with openings configured to receive and couple to a keyed optical component assembly. The keyed structure of the keyed optical component assemblies may be used to ensure proper orientation and alignment of associated optical elements during manufacturing of an optical subassembly.

Example Keyed Optical Component Assemblies

As discussed herein, a keyed optical component assembly is disclosed and is capable of being used with, for example, the optical transceiver 200 of FIG. 2. One such keyed optical component assembly 300 is collectively illustrated in FIGS. 3A and 3B. In an embodiment, the keyed optical component assembly 300 includes a base 305, that may also be referred to as a base portion 305, that is defined by at least one sidewall 306. The base 305 may have a thickness T that is substantially uniform or non-uniform. The base 305 includes at least one mounting surface, such as mounting surface 307. The mounting surface 307 may be configured to couple to an optical component 325. As shown, the optical component 325 is a thin-film WDM filter. In other embodiments, the optical component 325 may comprise other optical components including, for example, other filter types, mirrors, laser diodes, lenses, diffusers, polarizers, and prisms, just to name a few. In some embodiments, the optical component 325 is coupled to a mount 310 that extends outwardly (or away) from the mounting surface 307 of the base 305. The mount 310 may also be referred to as a mount structure 310. The mount 310 and/or the optical component 325 may be coextensive with the base 305. In other cases, the mount 310 and/or the optical component 325 may be offset a distance from an edge 320 of the base 305, forming an offset surface 315. In other words, the mount 310 and/or the optical component 325 may not necessarily be coextensive with the base 305. In other cases, the mount 310 and/or the optical component 325 is coextensive with the base 305. In some cases, the optical component 325 is integrally formed such that the base portion 305 and the mount are formed from a single piece of metal or other suitably rigid material, e.g., unitarily formed. In other cases, the optical component 325 is formed from multiple pieces. In any event, the optical component assembly 300 may be formed from a metal or other suitably rigid material.

Figure 3A:
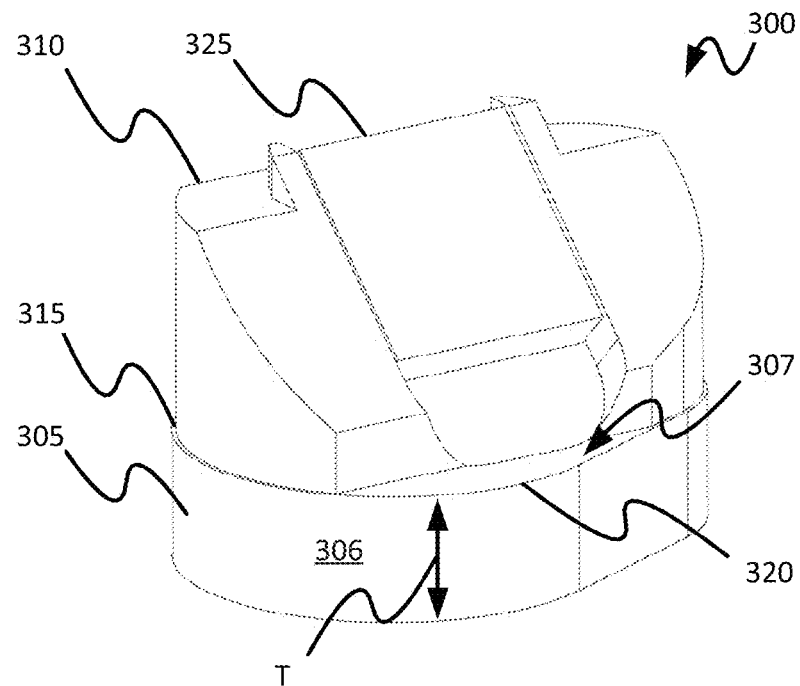
FIG. 3A is a perspective view of an example keyed optical component assembly consistent with the present disclosure.
Figure 3B:
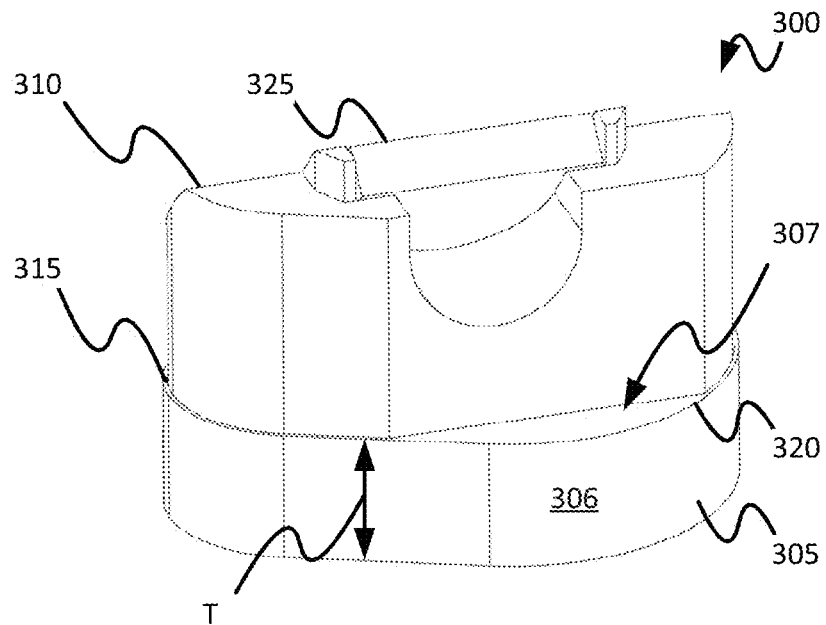
FIG. 3B is another perspective view of the example keyed optical component assembly of FIG. 3A consistent with the present disclosure.

Turning to FIG. 4, with additional reference to FIGS. 3A-3B, the base 305 of the optical component assembly 300 includes a shape defined by a plurality of arcuate regions such that the base 305 generally resembles, for example, a tear-drop shape, a pear shape, a piriform curve shape, or the like. For example, as shown in FIG. 4, an arcuate shaped first end region 425 extends from a first end 415 towards a second end 420 of the base 305. An arcuate shaped second end region 430 extends from the second end 420 towards the first end 415 of the base 305. As shown in FIG. 4, the first end 415 and the second end 420 represent opposing ends of a longitudinal axis LA of the base 305. Each of the arcuate shaped end regions 425 and 430 may be centered on a longitudinal axis LA of the base 305 and, in some embodiments, the base 305 may be symmetric about the longitudinal axis LA. However, in other cases the base 305 may not necessarily be symmetric about the longitudinal axis LA depending on a desired configuration.

As shown, the arcuate shaped first end region 425 and the arcuate shaped second end region 430 are adjoined by a tapered region 410. The tapered region 410 may be a substantially planar surface, such as shown, that extends between the arcuate shaped first and second end regions 425 and 430, respectively. The transition into the tapered region 410 may be such that the slope of the arcuate shaped first end region 425 and/or the arcuate shaped second end region 430 is substantially equal to the slope of the tapered region 410 at transitional regions generally indicated at 435 and 440. In some embodiments, the slope of the tapered region 410 may be defined by the widths W1 and W2, which may also be referred to as crosswise widths. In some cases, the slope of the tapered region 410 is about 45 degrees±20 degrees relative to the longitudinal axis LA.

Alternatively, the arcuate shaped first and/or second end regions 425,430 may transition into one or more planar surfaces that are substantially parallel to the longitudinal axis LA and the one or more planar surfaces may transition into the tapered region 410. Regardless of the location of the tapered region 410, the tapered region 410 generally tapers/narrows from the second width W2 to the first width W1.

The resulting shape may generally resemble any one or more of a tear-drop shape, a pear shape, a piriform curve shape, and the like. In some embodiments, the shape may be based on a curve corresponding to the equation for a pear curve:

$$r^2=(x^2+y^2)(1+2x+5x^2+6x^3+6x^4+4x^5+x^6-3y^2-2xy^2+8x^2y^2+8x^3y^2+3x^4y^2+2y^4+4xy^4+3x^2y^4+y^6)$$

where r may be a constant, x may be the length along the longitudinal axis LA, and y may be the width perpendicular to the longitudinal axis LA. When the above equation is plotted on a two-dimensional Cartesian coordinate system, the resulting two-dimensional shape may generally be described as pear-shaped.

As shown, the shape of the base 305 may also be based, at least in part, on a ratio between various crosswise widths of the base portion 305. For example, and in accordance with an embodiment, the first width W1 is about 1.0 millimeters (mm) and the second width W2 is about 1.5 mm. Thus the ratio of the first width W1 to the second width W2 may be 2:3. The ratio of the first width W1 to the second width W2 is not necessarily limited to 2:3. For example, the ratio of the first width W1 to the second width W2 may include any ratio ratio between 1:4 and 4:1, for example.

In addition, the shape of the base 305 may also be based, at least in part, on a length L1 of the tapered region 410 measured from the first transition region 435 to the second transition region 440. In some embodiments, the length L1 may be 1.0 mm. As such, a ratio of the length L1 to the first width W1 may be 1:1, and/or the ratio of the length L1 to the second width W2 may be 2:3. However, the ratio of the length L1 to the first width W1 is not necessarily limited to 1:1, and the ratio for the length L1 to the second width W2 is not limited to being 2:3. For example, the ratio of the length L1 to the first width W1 may be any ratio between 1:4 and 4:1. Further, the ratio of the length L1 to the second width W2 is not limited to being 2:3. For example, the ratio of the length L1 to the second width W2 may be any ratio between 1:4 and 4:1.

The shape of the base 305 may also be based, at least in part, on a height H1 measured from the first end 415 to the first transitional region 435 and/or a height H2 measured from the second end 420 to the second transition region 440. In some embodiments the height H1 is 0.5 mm and the height H2 is 1.3 mm. As such, a ratio of the height H1 to the first width W1 may be 1:2 and a ratio of the height H2 to the second width W2 may be 13:15. However, the ratio of the height H1 to the first width W1 is not necessarily limited to being 1:2. For example, the ratio of the height H1 to the first width W1 may be any ratio between 1:4 and 4:1. Further, the ratio of the height H2 to the second width W2 is not limited to being 13:15. For example, the ratio of the height H2 to the second width W2 may be any ratio between about 1:4 and 4:1.

The shape of the base 305 may also be based, at least in part, on the third width W3. In some embodiments the third width W3 may be 1.7 mm. As such, a ratio of the third width W3 to the first width W1 may be 13:10 and the ratio between the third width W3 and the second width W2 may be 13:15. However, the ratio of the third width W3 to the first width W1 is not limited to being 13:10. For example, the ratio of third width W3 to the first width W1 may be any ratio between 1:4 and 4:1. Further, the ratio of the third width W3 to the second width W2 is not limited to being 13:15. For example, the ratio of the third width W3 to the second width W2 may be any ratio between 1:4 and 4:1.

Further, although the above description describes ratios relative to the first width W1 and/or the second width W2, the shape of the base 305 is not limited to being based on such ratios. Therefore, for example, the shape of the base 305 may be based, at least in part, on a ratio of the height H1 to the length L1. For example, the ratio of the height H1 to the length L1 may be 1:2. However, the ratio of the height H1 to the length L1 is not limited to being 1:2. For example, the ratio of the height H1 to the L1 may be any ratio between 1:4 and 4:1.

The particular example ratios discussed above are not intended to be limiting. Other ratios may be utilized to shape the base portion 305 in a manner so as to provide a "keyed" asymmetric shape that ensures proper alignment and orientation. Thus any number of shapes may be achieved, with the resulting shape being regular or irregular depending on a desired configuration. For example, while FIG. 4 illustrates the base 305 as having a generally a tear-drop shape, the shape of the base 305 is not limited in this regard. For example, the base 305 may form various shapes such as triangles, trapezoids, pentagons, octagons, star-shapes, and/or combinations thereof. So long as the base 305 is asymmetric about at least one axis a keyed shape is formed, and thus, various alternatives and permutations should be apparent in light of this disclosure.

Continuing on, the resulting shape of the base 305 causes the base 305 to be received within a corresponding opening in an optical subassembly housing in, essentially, a single orientation. As such, the base 305 may be described as being keyed to an associated opening of an optical subassembly housing, such as the housing of the TOSA 125. Therefore, when the optical component 325 (FIG. 3B) and/or the mount 310 is coupled to a mounting surface 307 of the base 305, the orientation of the base 305 within the opening determines the orientation of the optical component 325 within the optical subassembly.

Figure 5A:
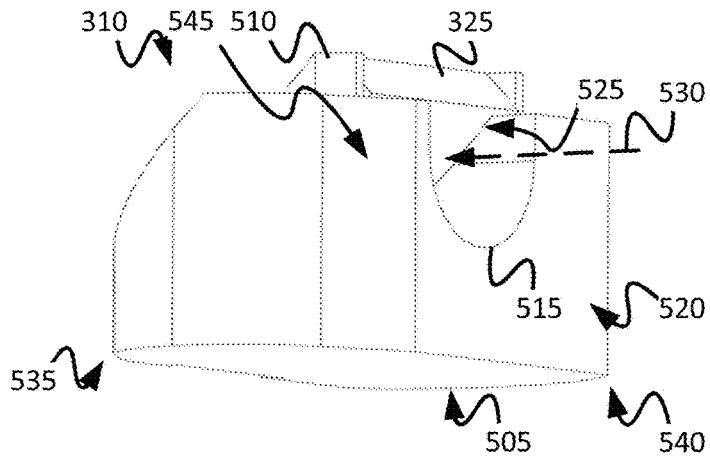
FIG. 5A is a perspective view of an example component mount assembly suitable for mounting onto the example base portion of FIG. 4.

As shown in FIG. 5A, an example embodiment of the mount 310 includes a mounting surface 505 that is configured to couple with the mounting surface 307 of the base 305. The mounting surface 505 of the mount 310 may be coupled to the base 305 using, for example, adhesives, welds, mechanical fits (e.g., threaded fits, friction fits, and the like), or any combinations thereof. In some embodiments, the mount 310 and the base 305 may be a unitary (e.g., monolithic) body that is formed, for example, by casting, molding, machining, or other suitable approach.

Figure 5B:
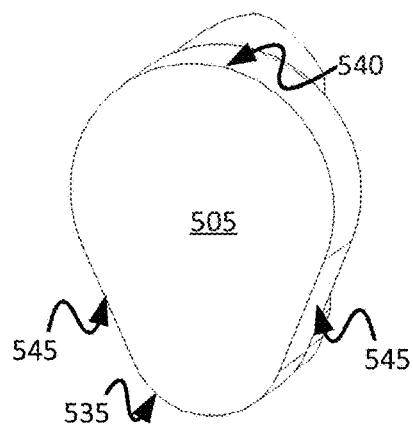
FIG. 5B is a side perspective view of the example component mount assembly of FIG. 5A.

The mount 310 may include a first mount arcuate region 535 and a second mount arcuate region 540, which is shown more clearly in FIG. 5B. Each of the first mount arcuate region 535 and the second mount arcuate region 540 may have a shape generally corresponding to the arcuate shaped first end region 425 and the arcuate shaped second end region 430 of the base 305, respectively. Thus the mount 310 may be accurately described as having a shape that generally follows the shape of the base 305. In some cases, when the mount 310 is coupled to the base 305, the arcuate shaped first end region 425 of the base 305 may be concentric with the first mount arcuate region 535 and the arcuate shaped second end region 430 of the base 305 may be concentric with the second mount arcuate region 540. The mount 310 may include a tapered mount region 545 that may be substantially parallel to at least a portion of the tapered region 410 of the base 305 when the mount 310 is coupled to the same. The tapered mount region 545 may transition into an end of the first mount arcuate region 535 and/or an end of the second mount arcuate region 540.

Figure 9:
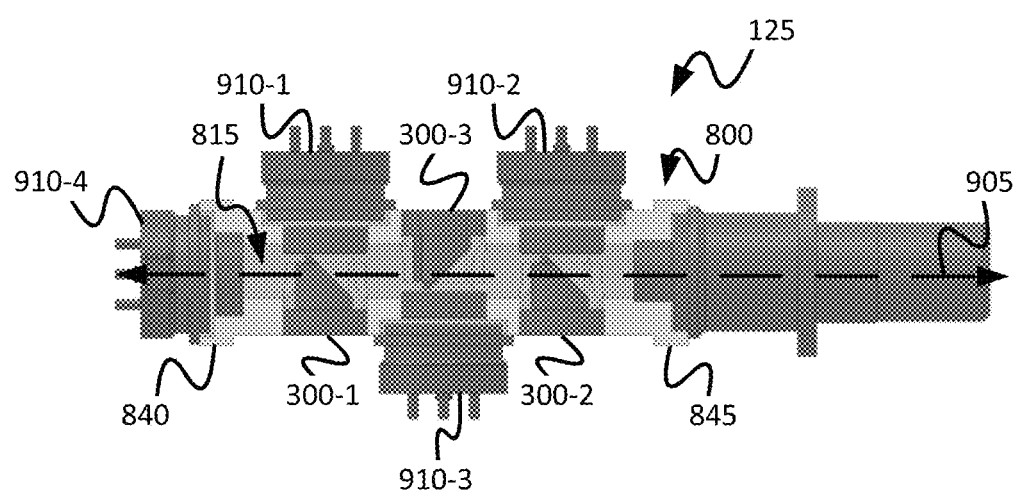
FIG. 9 is a partially cross-sectional view of an example transmitter optical subassembly (TOSA) consistent with the present disclosure.

The mount 310 may include one or more alignment elements 510 for aligning the optical component 325 with an optical pathway 515 extending through the mount 310. The optical pathway 515 may be defined by an opening provided by the vertical sidewall 520. The optical pathway 515 of the mount 310 is positioned such that, when the base 305 is received within the opening of an optical subassembly housing, an optical beam 530 passing through the optical subassembly also passes through the optical pathway 515 and is incident with the optical component 325. For example, FIG. 9 shows a plurality of optical component assemblies aligned with an optical path extending through a TOSA housing. The optical pathway 515 may be aligned with the center of the vertical surface 520 and/or an optical component mounting surface 525, although other embodiments are within the scope of this disclosure.

Figure 6:
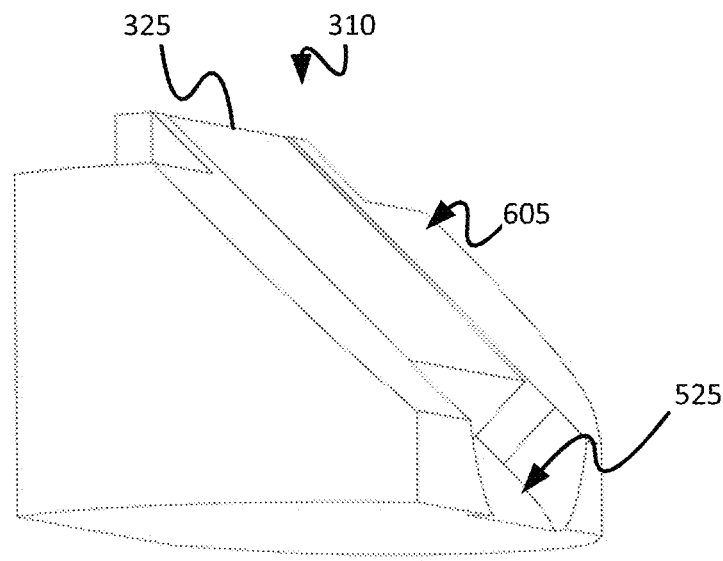
FIG. 6 is another perspective view of the example component mount assembly of FIG. 5A.

As shown in FIG. 6, the optical component mounting surface 525 may be recessed within the mount 310 such that the optical component 325 does not extend beyond a front surface 605 of the mount 310. For example, the optical component 325 may be flush with the front surface 605 of the mount 310. However, in some embodiments, the optical component 325 may extend beyond the front surface 605 of the mount 310. In some embodiments, the optical component 325 can be coupled to the mount 310 such that it is coextensive with optical component mounting surface 525. In other embodiments, the optical component 325 can be coupled to the mount 310 such that it covers only a portion of the optical component mounting surface 525.

Figure 7:
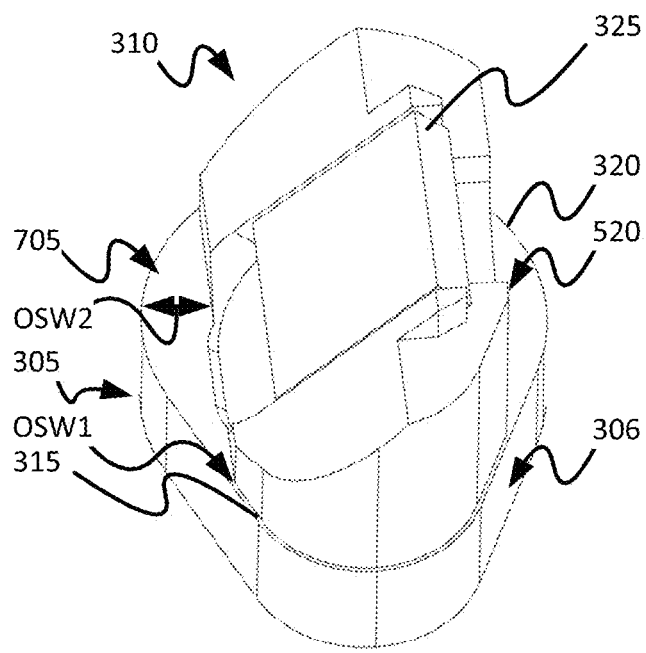
FIG. 7 is another perspective view of the keyed optical component assembly of FIG. 3A consistent with the present disclosure.

As shown in FIG. 7, once coupled to the base 305, the offset of the mount 310 from the edge 320 of the base 305 may be constant or non-constant. For example, a first width OSW1 of the offset surface 315 may be less than at least one additional width OSW2 of the offset surface 315. The at least one additional width OSW2 of the offset surface 315 may define one or more step regions 705 on the base 305. The one or more step regions 705 may include a substantially planar surface that may be perpendicular to one or both of the sidewall 306 of the base 305 and the vertical surface 520 of the mount 310. In other embodiments, the mount 310 may be coupled to the base 305 such that there is no offset between the mount 310 and at least a portion of the edge 320 of the base 305.

Regardless of whether the optical component 325 is coupled to the base 305 using the mount 310, the orientation of the optical component 325 may be fixed relative to the base 305. Therefore, when the base 305 is press-fit into an opening of an optical subassembly housing having a complimentary shape, the optical alignment of the optical component 325 within the housing will be based, at least in part, on the orientation of the base 305 within the opening.

Figure 8A:
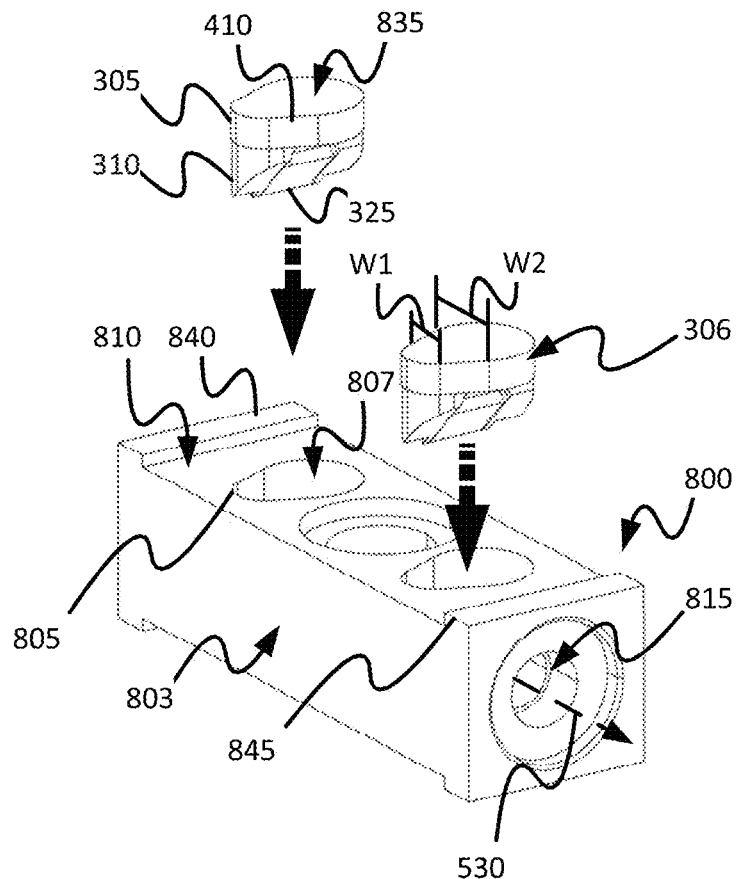
FIG. 8A is an exploded view of an example optical subassembly housing and a plurality of associated keyed optical component assemblies consistent with the present disclosure.

Turning to FIG. 8A, an optical subassembly housing 800 having a plurality of sidewalls 803 includes at least one opening 805 transitioning from an exterior surface 810 of the optical subassembly housing 800 and into a cavity 815 that extends through the optical subassembly housing 800. The cavity 815 may be defined by one or more sidewalls 803 of the optical subassembly housing 800.

Figure 8B:
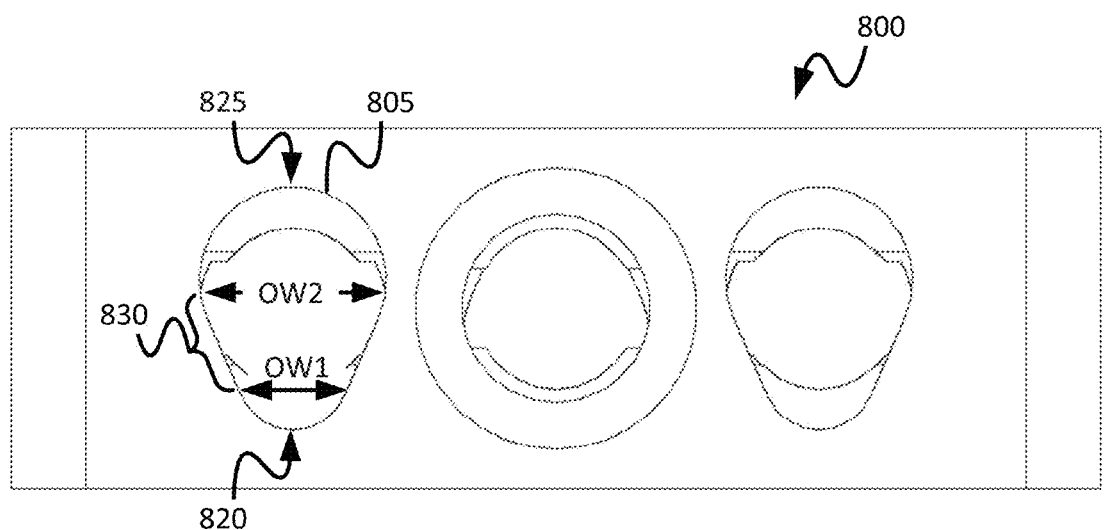
FIG. 8B is a top plan view of an example optical subassembly housing for receiving a keyed optical component assembly consistent with the present disclosure.

The opening 805 may have a shape that generally corresponds to, or is complimentary to, the shape of the base 305. For example, when the base 305 has a tear-drop shape, a pear shape, or a piriform curve shape, the opening 805 may have a first arcuate opening end 820 and a second arcuate opening end 825, which is shown more clearly in FIG. 8B. A tapered opening region 830 may extend between the first arcuate opening end 820 and the second arcuate opening end 825. The tapered opening region 830 may be substantially parallel to the tapered region 410 of the base 305. To facilitate the formation of a press-fit at an interface between the sidewall 306 of the base 305 and a sidewall 807 of the opening 805, the size of the opening 805 is smaller, in at least one dimension, than the base 305. For example, a first opening width OW1 may be less than the width W1 of the base 305 and/or a second opening width OW2 may be less than the width W2 of the base 305.

As the base 305 is press-fit into the opening 805, the mount 310 and/or the optical component 325 extends into the cavity 815. The shape of the base 305 and the shape of the opening 805 allow the base 305 to have essentially a single orientation within the opening 805 such that the mount 310 and/or the optical component 325 extend into the cavity 815. Therefore, once the base 305 is at least partially pressed into the opening 805, the optical component 325 is aligned in a horizontal plane based on the position/orientation of the optical component 325 on the base 305. The vertical position of the optical component 325 within the cavity 815 should be such that when the optical beam 530 enters the cavity 815 the optical beam 530 passes through the optical component 325. In other words, as will be discussed further in reference to FIG. 9, the optical component 325 is in the beam path of the optical beam 530. In some embodiments, the optical component 325 is vertically aligned within the cavity 815 when a bottom surface 835 of the base 305 is substantially flush with the exterior surface 810 of the optical subassembly housing 800. Thus the bottom surface 835 of the base 305 may form at least a portion of a sidewall defining the housing of the optical subassembly housing 800. In other embodiments, the optical component 325 is vertically aligned, for example, when the base 305 is a predetermined distance above or below the exterior surface 810. The predetermined distance may, for example, be determined during the press-fitting process by measuring changes in the output power of the optical beam 530 as the base 305 is being press-fit into the opening 805. In these situations, when a desired output power is obtained the optical component 325 may be considered properly aligned within the cavity 815. Thus, after the press-fitting process is completed, the optical component 325 may aligned within the cavity 815 such that an optical beam generally indicated at 530 can pass from a first end 840 of the optical subassembly housing 800, through the optical component 325, and exit at a second end 845 of the optical subassembly housing 800.

For example, turning to FIG. 9, the optical subassembly housing 800 is shown assembled as the multi-channel TOSA 125. The multi-channel TOSA 125 is illustrated with a semi-transparent housing 800 for the purposes of clarity and practicality. As shown, the multi-channel TOSA 125 includes the optical subassembly housing 800 with a plurality of sidewalls extending generally in parallel along an axis 905 from the first end 840 to the second end 845 of the optical subassembly housing 800. An inner surface of the plurality of sidewalls define the cavity 815 within the optical subassembly housing 800. As shown, keyed optical component assemblies 300-1 to 300-3 are configured as filter assemblies which are press-fit into the housing 800. The multi-channel TOSA 125 further includes a plurality of TO can laser packages 910-1 to 910-4 coupled to the housing 800. Filters of the keyed optical component assemblies 300-1 to 300-3 can optically align and couple to a beam path that generally extends along the axis 905. Likewise, the TO can laser packages 910-1 to 910-4 can optically align and couple respective laser devices with the beam path. Thus, in use, the multi-channel TOSA 125 can multiplex multiple channel wavelengths and launch the same along the beam path to transmit the multiplexed signal via, for instance, the transmitter optical fiber 150 (FIG. 1).

In some embodiments, to prevent or reduce the ingress of contaminants into the optical subassembly housing 800, an interstitial filler, for example, a sealant, may be applied at the interface between the opening 805 and the base 305. The application of the interstitial filler at the interface between the opening 805 and the base 305 is generally disclosed and described in U.S. patent application Ser. No. 15/137,794 entitled "Techniques for Reducing Ingress of Foreign Matter Into an Optical Subassembly," filed on Apr. 25, 2016, which is incorporated herein by reference.

Additional Example Embodiments

In accordance with an aspect of the present disclosure an optical component assembly is disclosed. The optical component assembly including a base comprising at least one sidewall, the base configured to form an interference fit when coupled to an optical subassembly housing, the at least one sidewall defining a first arcuate region at a first end of the base and a second arcuate region at a second end of the base, wherein the at least one sidewall further defines a tapered region extending between the first arcuate region and the second arcuate region, the tapered region including a first width adjacent the first arcuate region, and a second width adjacent the second arcuate region, the second width being greater than the first width, and a mounting surface defined by the base to couple to at least one optical component.

In accordance with another aspect of the present disclosure an optical subassembly is disclosed. The optical subassembly including a housing having a plurality of housing sidewalls that define a cavity, an opening transitioning from an exterior surface of at least one of the housing sidewalls into the cavity, and an optical component subassembly at least partially disposed within the opening, the optical subassembly component comprising a base comprising at least one sidewall, the base configured to form a friction fit with the opening of the housing, the at least one sidewall of the base defining a first arcuate region at a first end of the base and a second arcuate region at a second end of the base, wherein the at least one sidewall of the base further defines a tapered region extending between the first arcuate region and the second arcuate region, the tapered region including a first width adjacent the first arcuate region, and a second width adjacent the second arcuate region, the second width being greater than the first width, and a mounting surface defined by the base to couple to at least one optical component.

In accordance with yet another aspect of the present disclosure an optical transceiver module is disclosed. The optical transceiver module comprising a transceiver housing, a transmitter optical subassembly (TOSA) having a plurality of transistor outline (TO) can laser packages fixedly attached thereto and located in the transceiver housing for transmitting optical signals at different channel wavelengths, the TOSA comprising a housing including at least a first and second sidewall on opposite sides of the housing and extending along a first axis from a first end to a second end, and forming a compartment defined by an inner surface therein, the first sidewall defining at least one sidewall opening, at least one optical component assembly that is at least partially disposed within the at least one sidewall opening, each of the at least one optical component assembly comprising a base comprising at least one sidewall, the base configured to form a friction fit with the at least one sidewall opening of the housing, the at least one sidewall of the base defining a first arcuate region at a first end of the base and a second arcuate region at a second end of the base, wherein the at least one sidewall of the base further defines a tapered region extending between the first arcuate region and the second arcuate region, the tapered region including a first width adjacent the first arcuate region, and a second width adjacent the second arcuate region, the second width being greater than the first width, a mounting surface defined by the base to couple to at least one optical component, and an optical component coupled to the mounting surface and extending into cavity of the housing, a multi-channel receiver optical assembly (ROSA) located in the transceiver housing for receiving optical signals at different channel wavelengths.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:
1. An optical component assembly comprising:
   a base comprising at least one sidewall to form an interference fit when coupled to an optical subassembly housing, the at least one sidewall extending along a longitudinal axis from a first end to a second end of the base, the at least one sidewall defining a first arcuate region at a first end of the base and a second arcuate region at a second end of the base;
   wherein the at least one sidewall further defines a tapered region extending between the first arcuate region and the second arcuate region, the tapered region including a first crosswise width adjacent the first arcuate region, and a second crosswise width adjacent the second arcuate region, the second crosswise width being greater than the first crosswise width;
   a mounting surface defined by the base to couple to at least one optical component; and
   wherein the at least one sidewall of the base defines a generally tear-drop shape.
2. An optical subassembly comprising:
   a housing having a plurality of sidewalls that define a cavity and at least a first opening to couple to an optical component assembly; and
   an optical component assembly at least partially disposed within the first opening, the optical component assembly comprising:
      a base comprising at least one sidewall, the base configured to form a friction fit with the first opening of the housing, the at least one sidewall of the base extending along a longitudinal axis from a first end to a second end of the base, wherein the at least one sidewall defines a first arcuate region at a first end of the base and a second arcuate region at a second end of the base;
      wherein the at least one sidewall of the base further defines a tapered region extending between the first arcuate region and the second arcuate region, the tapered region including a first crosswise width adjacent the first arcuate region, and a second crosswise width adjacent the second arcuate region, the second crosswise width being greater than the first crosswise width; and
      a mounting surface defined by the base to couple to at least one optical component, wherein the at least one sidewall of the base defines a generally tear-drop shape.
3. An optical transceiver module comprising:
   a transceiver housing;
   a transmitter optical subassembly (TOSA) having a plurality of transistor outline (TO) can laser packages fixedly attached thereto and located in the transceiver housing for transmitting optical signals at different channel wavelengths, the TOSA comprising:
      a housing including at least first and second sidewalls on opposite sides of the housing and extending along a first axis from a first end to a second end and forming a cavity defined by an inner surface therein, the first sidewall defining at least one opening;
      at least one optical component assembly at least partially disposed within the at least one opening, the at least one optical component assembly comprising:
         a base comprising at least one sidewall to form a friction fit with the at least one opening of the housing, the at least one sidewall extending along a longitudinal axis from a first end to a second end of the base, and wherein the at least one sidewall of the base defines a first arcuate region at a first end of the base and a second arcuate region at a second end of the base;

wherein the at least one sidewall of the base further defines a tapered region extending between the first arcuate region and the second arcuate region, the tapered region including a first crosswise width adjacent the first arcuate region, and a second crosswise width adjacent the second arcuate region, the second crosswise width being greater than the first crosswise width;

a mounting surface defined by the base to couple to at least one optical component; and an optical component coupled to the mounting surface and extending into the cavity of the housing;

wherein the at least one sidewall of the base defines a generally tear-drop shape;

a multi-channel receiver optical assembly (ROSA) located in the transceiver housing for receiving optical signals at different channel wavelengths.

* * * * *